United States Patent [19]

Solheim

[11] Patent Number: 5,071,778
[45] Date of Patent: Dec. 10, 1991

[54] SELF-ALIGNED COLLECTOR IMPLANT FOR BIPOLAR TRANSISTORS

[75] Inventor: Alan G. Solheim, Puyallup, Wash.

[73] Assignee: National Semiconductor Corporation, Santa Clara, Calif.

[21] Appl. No.: 543,907

[22] Filed: Jun. 26, 1990

[51] Int. Cl.[5] .................... H01L 21/265; H01L 29/70
[52] U.S. Cl. .............................. 437/31; 148/DIG. 10
[58] Field of Search .................. 437/31; 148/DIG. 10, 148/DIG. 18; 357/34, 43

[56] References Cited

U.S. PATENT DOCUMENTS

| | | |
|---|---|---|
| 3,955,269 | 5/1976 | Magdo et al. |
| 4,484,388 | 11/1984 | Iwasaki |
| 4,507,847 | 4/1985 | Sullivan |
| 4,536,945 | 8/1985 | Gray et al. |
| 4,609,568 | 9/1986 | Koh et al. |
| 4,764,480 | 8/1988 | Vora |

OTHER PUBLICATIONS

Gomi et al., *IEDM Technical Digest* (1988) pp. 744–747.
Konaka et al., *Conf. on Solid State Devices and Materials*, Tokyo, 1987, pp. 331–334.
Van Wijnen et al., *BCTM*, Minneapolis, 1989, pp. 160–163.
de Jong et al., *BCTM*, Minneapolis, 1989, pp. 182–185.
Brassington et al., *IEEE Trans. Elect. Dev.* (1989) 36:712–719.
Momose et al., *IEDM Trans. Elect. Dev.* (1985) ED-32:217–223.
Kapoor et al., *1985 Custom Integrated Circuits Conference*, pp. 184–187.
Ghandi, "Chapter 6–Ion Implantation," *VLSI Fabrication Principles*, John Wiley & Sons, Inc., 1983, pp. 299–370.

Primary Examiner—Olik Chaudhuri
Assistant Examiner—Long Pham
Attorney, Agent, or Firm—Townsend and Townsend

[57] ABSTRACT

An improved method of forming bipolar devices and an improved bipolar device. The method provides for formation of an emitter contact on the base of a bipolar transistor followed by a collector implant. The collector implant varies the doping profile of the collector under the emitter contact but not adjacent the emitter contact, providing improved device characteristics. The collector implant penetrates the base of the transistor, preferably having a range deeper than the thickness of the single-poly contact layer.

19 Claims, 11 Drawing Sheets

SELF-ALIGNED COLLECTOR IMPLANT FOR BIPOLAR TRANSISTORS

BACKGROUND OF THE INVENTION

The present invention relates to the field of semiconductor devices and their manufacture. More specifically, in one embodiment the invention provides a bipolar transistor with improved performance characteristics. The device is manufactured by a process which includes a self-aligned collector implant.

Bipolar devices and their manufacture are well known to those of skill in the art and are disclosed in, for example, copending application Ser. No. 07/503,498, which is incorporated herein by reference for all purposes. Such processes provide for the formation of an n+ buried layer in a substrate followed by formation of an epitaxial silicon layer on a surface of the substrate. A base region is implanted or diffused into the epitaxial layer, followed by formation of a polysilicon emitter above the base region.

While meeting with substantial success, such prior processes and devices have also met with certain limitations. For example, in the region of the base-collector junction, the collector is of relatively constant and relatively light dopant concentration. This limits the performance of such devices. In particular, the value of $F_t$ (the frequency at which the forward collector emitter current gain is unity) and the emitter current density are less than would be desired. Some prior devices have modified the doping of the epitaxial layer to account for these problems, but this solution tends to increase the capacitance of the extrinsic base region. Further, changes in epitaxial layer will impact all of the devices on a die, not just the bipolar devices in question.

From the above it is seen that an improved method of fabricating bipolar transistors and improved devices resulting therefrom are desired.

SUMMARY OF THE INVENTION

An improved bipolar device and an improved method of fabricating bipolar transistors are disclosed. The method of fabricating bipolar transistors includes the steps of forming a base region of a bipolar transistor over a collector region. An emitter contact is formed on the base region. The emitter contact preferably is in the form of a stripe and is patterned from a layer of polysilicon. A high energy, low dose collector implant is then performed. The collector implant provides dopants of the same conductivity type as the collector of the bipolar transistor and increases the dopant concentration of the collector in the region(s) below and aligned with the emitter stripe. Thereafter, implants and/or diffusions are conducted to form the extrinsic base region of the transistor. Adjacent the emitter stripe the implant does not substantially impact the collector dopant concentration since most of the dopant is positioned in the buried layer.

The process results in devices having improved $F_t$ and emitter current density. At the same time, low current device performance is not impacted appreciably. For example, parasitic capacitances are not changed significantly, particularly when epitaxial layer dopant concentrations are appropriately selected. Further, there is little impact on resistors and on the device fabrication process.

Accordingly, in one embodiment the invention provides a method of forming a semiconductor structure, the structure including an emitter region, a base region, and a collector region. The method includes the steps of: in a semiconductor having a first surface, forming the base region above the collector region, the base region of a first conductivity type, the collector region of a second conductivity type; forming an emitter contact above the base region, the emitter contact extending to the first surface; and implanting dopants of the second conductivity type with an implant energy and dose selected such that a range of the dopants of second conductivity type in the region below the emitter contact is below a base collector junction under the emitter. Preferably, the peak dopant concentration below the emitter contact from the collector implant occurs within the epitaxial layer in which the collector is formed. Preferably, the implant energy and dose of the implant is selected such that peak dopant concentration of the implant is in the heavily doped buried layer of the transistor in regions adjacent the emitter stripe.

A semiconductor structure in semiconductor material having a first surface is also disclosed. The structure includes: a collector region of a first conductivity type; a base region formed along the first surface above the collector region, the base region of a second conductivity type; and an emitter contact formed on the major surface, the collector region comprising a first dopant profile in a first region substantially aligned with and below the emitter contact and a second dopant profile in a second region adjacent the emitter contact. The peak dopant concentration of the first dopant profile is preferably substantially higher than the peak dopant concentration of the second region.

A further understanding of the nature and advantages of the inventions herein may be realized by reference to the remaining portions of the specification and the attached drawings.

DESCRIPTION OF THE PREFERRED EMBODIMENTS

CONTENTS

I. General
II. Device Fabrication
III. Device Performance

I. General

Figure 1:
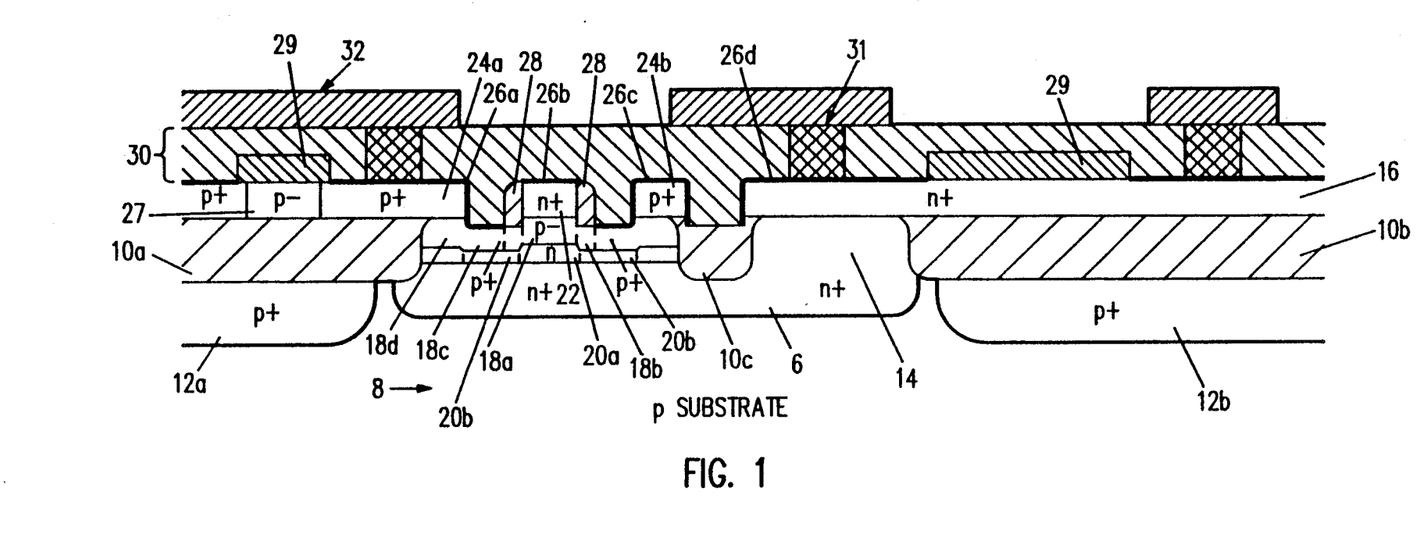
FIG. 1 is a cross-section of a bipolar transistor according to one embodiment of the invention.

FIG. 1 is a cross-section of a vertical bipolar transistor and a resistor according to a first embodiment of the invention. It will be recognized by those of skill in the art that while the invention is illustrated with primary regard to npn transistors, the role of n- and p-type conductivity regions could readily be reversed without departing from the scope of the invention herein. Still further, the invention could readily be applied to either lateral or vertical devices.

The bipolar transistor includes an n+ collector buried layer 6 in a p- substrate 8. The buried layer 6 serves as a low resistivity path for mobile charge carriers from the collector of the bipolar transistor structure. In preferred embodiments the peak dopant concentration of the collector buried layer 6 is between about $10^{17}$ and $10^{20}/cm^3$, although peak dopant concentrations between about $10^{18}$ and $10^{19}/cm^3$ are preferred. The resistivity of the substrate is preferably between about 30 and 50 ohm-cm.

Adjacent the bipolar transistor, field oxide regions 10a and 10b are underlain by p+ channel stops 12a and 12b. The field oxide regions and channel stops serve to isolate the transistor from adjacent transistors, and at the same time create a very high threshold voltage for the parasitic field effect structure formed by the substrate, the field oxide region and any overlying interconnect regions. In preferred embodiments, the peak dopant concentration in the channel stops is between about $10^{17}$ and $10^{18}/cm^3$. Oxide region 10c separates collector sink 14 from the active region of the transistor.

A collector sink 14 extends from the collector buried layer 6 to a collector contact 16. The collector sink preferably has a dopant concentration of the same order of magnitude as the buried layer. Heavily doped n+ collector contact 16 acts as a first level interconnect to other devices.

Collector region 20 is formed between the collector buried layer 6 and base region 18. Collector region 20 includes a first region 20a and second regions 20b. The first region 20a is aligned with emitter contact 22 of the transistor. The first region and the second regions of the collector differ in their doping profile. Specifically, when compared to the second regions 20b, the first region 20a contains a generally higher dopant concentration. For example, the peak dopant concentration in first region 20a (which may extend, for example, 0.1 to 0.4 microns into the epitaxial layer) is preferably 2 and 100 times higher than in the second regions, with preferred embodiments of 5 to 20 times higher. This variable dopant profile is obtained through the use of a high energy phosphorous implant after a polycrystalline etch which forms the emitter and base contacts of the transistor. Hence, the first region of the collector is substantially self-aligning to the emitter of the transistor because the emitter contact serves to mask the implant such that the range of the implant is slightly below the base collector junction under the emitter contact, but well into the buried layer adjacent the emitter contact.

The base region includes a shallow, lightly doped region 18a which is also substantially self-aligned with an n+ emitter contact 22. The lightly doped region extends only about 1,800 to 2,200 Å from the bottom of the emitter contact. Adjacent the lightly doped region of the base, moderately doped regions 18b (having peak dopant concentrations of about $10^{18}/cm^3$) extend under the sidewall oxide regions 28. Adjacent the moderately doped regions, more heavily doped regions 18c extend from under the sidewall oxide and are self-aligned with p+polycrystalline silicon (polysilicon) base contacts 24a and 24b. The more heavily doped regions 18c are preferably doped to a peak dopant concentration of between about $5 \times 10^{18}$ and $5 \times 10^{19}$ with a preferred range of from $8 \times 10^{18}$ to $2 \times 10^{19}$. Regions 18b and 18c preferably extend between about 0.20 and 0.25 μm into the substrate from the bottom of the emitter contact. Regions 18d are diffused from the overlying p+ base contacts. Regions 18b, 18c, and 18d collectively form the extrinsic base region of the transistor (which is sometimes referred to by those of skill in the art as the link base).

Refractory metal silicide contacts 26a, 26b, 26c, and 26d, such as titanium silicide contacts, are used for the base contacts, the emitter contact, and the collector contact, respectively. The base contact silicide 26a/26c extends along the upper portion of the base contact poly 24a/24b, down its sidewall, and along the upper portion of the single-crystal base region 18 to sidewall oxide 28 on the emitter contact. The silicide contact 26b on the emitter contact extends along the upper surface of the emitter contact 22 from one sidewall to the opposite sidewall. The collector contact 16 is covered along its upper surface and sidewall with silicide region 26d. Silicide contacts as shown herein provide significantly reduced resistance to the polycrystalline and monocrystalline features such as the emitter, base, and collector contacts, as well as to the base region itself.

A resistor 27, the base contact 24a, emitter contact 22, base contact 24, and the collector contact 16 are all made from a single layer of polysilicon. The resistor 27 and other selected regions include silicide exclusion oxide 29 and the entire surface of the device is provided with cap oxide layer 30. Contact metal layer 32 extends along the cap oxide layer at selected locations for interconnection of the device. In preferred embodiments, tungsten plugs 31 fill the contact apertures in the cap oxide.

II. Device Fabrication

Figure 2A:
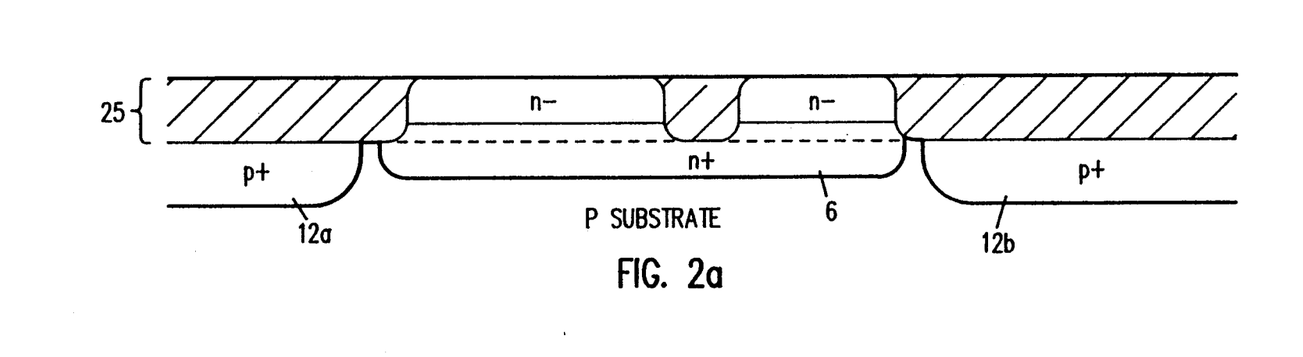
FIGS. 2a to 2l illustrate fabrication of the bipolar transistor shown in FIG. 1.

FIGS. 2a to 2l illustrate fabrication of a bipolar transistor according to one embodiment of the invention. FIG. 2a shows the bipolar transistor at a first intermediate stage of fabrication. To reach the stage shown in FIG. 2a, a layer of initial thermal oxide is formed on a p-type substrate. A denuded zone (depleted of oxygen contaminants and the like) 10 $\mu$m to 20 $\mu$m into the substrate and thin screen oxide region are then formed simultaneously using conventional thermal processing.

A mask is then formed on the substrate to define the buried layer 6 of the transistor. It should be noted that by "mask" it is intended to mean a material formed on a substrate for protection of selected regions (as opposed to the lithographic reticle used to form the mask on the substrate). An n+ implant using arsenic forms the buried layer of the bipolar transistor and the buried layer mask is then removed. In preferred embodiments the buried layer is doped to a peak dopant concentration of between about $10^{19}$ and $10^{20}$cm$^3$ with a dopant concentration of about $5\times10^{19}$/cm$^3$ preferred. The buried layer implant uses an implant energy of between about 50 and 150 keV with an implant energy of between about 75 and 100 keV preferred.

The buried layer is thereafter annealed at a temperature of about 1100° C. for a time of about 80 minutes and another layer of oxide is formed on the surface of the device. A mask is then formed on the device so as to define the channel stops of the device and an implant is performed to provide p+ channel stops 12a and 12b, preferably using boron. In preferred embodiments the p+ channel stops have a peak dopant concentration of between about $10^{16}$ and $10^{19}$cm$^3$ with a dopant concentration of about $10^{17}$cm$^3$ preferred. The p+ implant used to form the channel stops uses an implant energy of between about 100 and 200 keV with an implant energy of between about 125 and 175 keV preferred.

The mask and the oxide layer on the substrate are then removed. An n-type epitaxial silicon layer 25 having a dopant concentration of about $10^{15}$ to $10^{16}$/cm$^3$, and preferably about $5\times10^{15}$/cm$^3$, is grown on the device and an oxide layer is formed thereon, also diffusing the n+ and p+ dopants upwards into the epitaxial layer from the underlying substrate. In preferred embodiments the epitaxial silicon layer has a thickness of between about 0.8 and 1.5 $\mu$m with a thickness of between about 1.0 and 1.2 $\mu$m preferred. Conventional processes are then used to form field oxide regions 10a, 10b, and 10c.

Figure 2B:
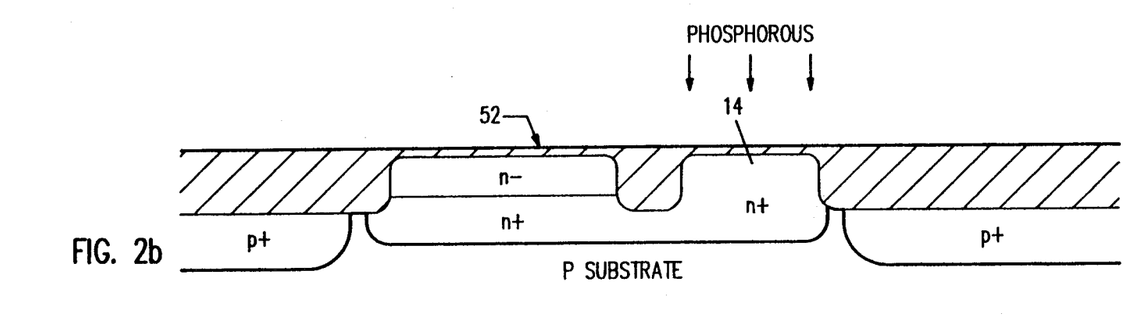

As shown in FIG. 2b, a screen oxide 52 is then formed on the base and collector regions of the bipolar transistor. The device is then masked with photoresist to expose only the sink region 14 of the device and an n+ implant is performed with phosphorus so as to dope the sink region to a peak dopant concentration of between about $1\times10^{19}$ and $1\times10^{21}$/cm$^3$ using an implant energy of between about 100 to 200 keV. The sink mask is then removed.

Figure 2C:
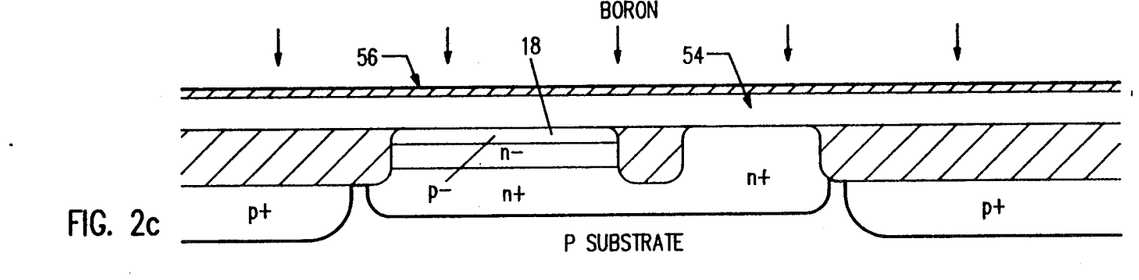

An intrinsic polysilicon layer 54 and oxide layer 56 are then formed on the surface of the device as shown in FIG. 2c. The polysilicon preferably has a thickness of about 0.1 to 0.5 $\mu$m. In one preferred embodiment, the height of the polysilicon is about 0.3 $\mu$m. In a preferred embodiment, the combined height of the poly, the nitride, and the overetch is about 0.55 $\mu$m. An unmasked p implant is performed, preferably using boron, across the entire surface of the device. The p-type material is annealed in an oxygen environment so as to form oxide thereon and diffuse p-type material from the polysilicon into the single-crystal base region such that the peak dopant concentration in the base region 18 is between about $1\times10^{17}$ and $2\times10^{18}$/cm$^3$ with a peak dopant concentration of about $1\times10^{18}$/cm$^3$ preferred. The base implant uses an implant energy of between about 20 and 60 keV with an energy of between about 30 and 50 keV preferred. In preferred embodiments, this diffusion step results in a base thickness below the bipolar emitter contact of between about 0.15 and 0.25 $\mu$m with a thickness of about 0.20 $\mu$m preferred. This implant is also used to form lightly doped regions of polysilicon to act as, for example, resistors.

A mask is then formed on the device so as to define base contact region 24a and 24b, and contact portions of the resistor. A p+ implant is performed using boron to dope these regions to a peak dopant concentration of about $1\times10^{20}$cm$^3$. The p+ mask is removed and an n+ mask and implant is used to dope the emitter contact region 22 and the collector contact region 16 to a similar dopant concentration. The n+ and p+ implants preferably use an implant energy of between about 40 and 100 keV.

Subsequent thermal cycles will diffuse material from the emitter contact into the underlying single-crystal silicon to form the emitter of the device. It is to be understood that while the polysilicon region 22 is referred to herein as the emitter contact and the underlying diffused region is referred to herein as the emitter, those of skill in the art sometimes refer to the contact and emitter collectively as the "emitter." No difference in meaning is intended herein.

Figure 2D:
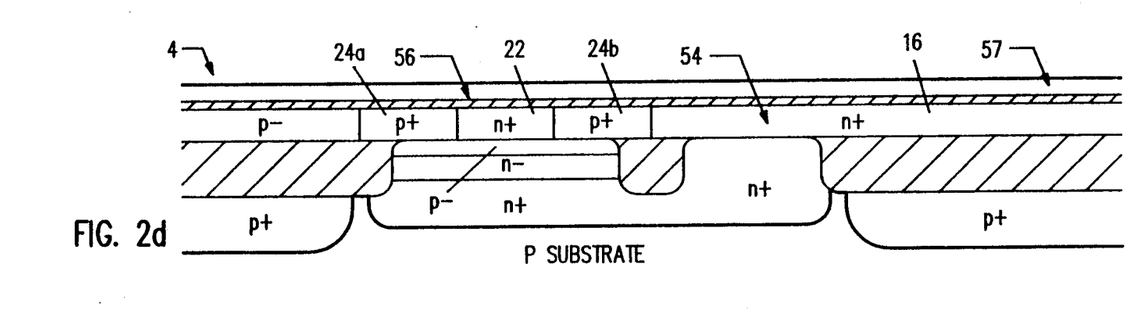

The n+ mask is then removed and a nitride layer 57 is deposited on the surface of the structure as shown in FIG. 2d. The device is then masked so as to protect the p+ resistor/base contact 24a, the base contact 24b, the emitter contact 22, and the collector contact 16. The exposed poly is etched to provide the poly structure shown in FIG. 2e, in which the base/collector region of the transistor is shown in greater detail. The poly overetch is controlled to be slightly greater than the emitter diffusion depth in order to reduce emitter-base capacitance. In preferred embodiments, the emitter will ultimately be diffused about 1000 Å into the epi layer while the silicon is over etched about 1200 Å to 1500 Å from the surface of the epi layer. The resist is then removed. While the invention is illustrated in the figures with vertical sidewalls on the emitter, base and collector contacts, it should be recognized that the sidewalls of such features need not be and often will not be exactly vertical.

Figure 2E:
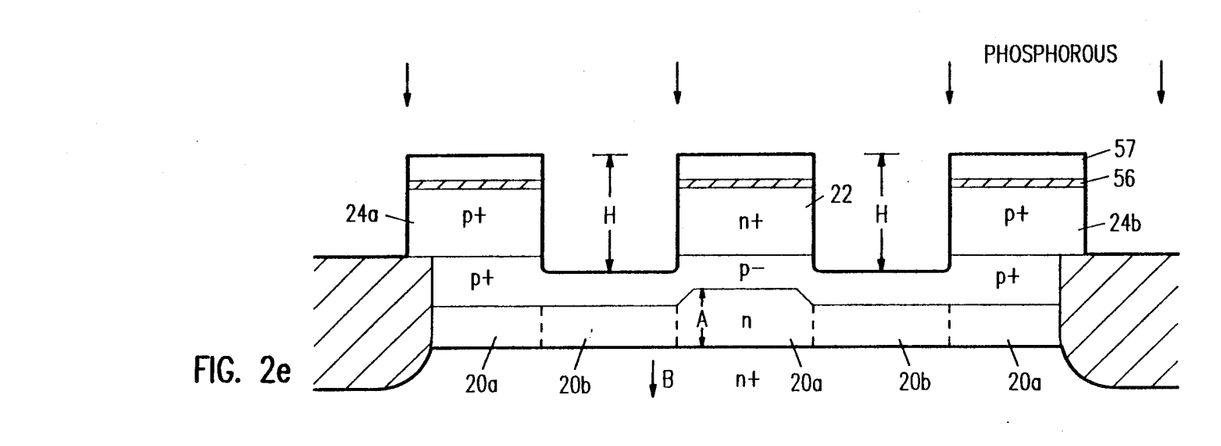

Thereafter, as illustrated in FIG. 2e, a high energy implant with n-type dopants, preferably phosphorous is then conducted. According to preferred embodiments, the high energy implant preferably uses an implant energy of about 650 to 750 KeV with a polysilicon/nitride/overetch depth of 0.55 $\mu$m, although implant energies ranging from 300 keV to 1 meV may also provide beneficial results according to some embodiments depending upon the thickness indicated by "H" in FIG. 2e. The dose of the implant is most preferably about $1\times10^{12}$/cm$^3$ to $5\times10^{12}$/cm$^3$, although in some cases doses ranging from about $1\times10^{12}$ to $2\times10^{13}$ may be beneficially used.

The implant energy is preferably selected such that the range of the collector implant is deeper than the combined thickness of the polysilicon layer plus the intrinsic base thickness while preferably still placing the peak dopant concentration in the epitaxial silicon layer below the emitter contact stack. Since the range of the dopants is deeper than the polysilicon thickness plus the thickness of the base region, the implant places the peak dopant concentration well into the buried layer adjacent the emitter contact. Accordingly, the peak dopant concentration from the implant is generally in the region designated by "A" in the first region and "B" in the regions adjacent the emitter contact. The range is usually greater than 0.1 micron, preferably greater than about 0.3 microns, and most preferably greater than about 0.5 microns and most preferably about 0.7 μm. Accordingly, it is unnecessary to provide a mask for this implant since there is a negligible impact on polycrystalline resistors, diffused resistors, and the like. Of course, some benefits will be provided by way of an additional mask and in preferred embodiments the collector implant is masked. A masked implant will serve to reduce the capacitance under the p+ polysilicon base contact, provide high and low current devices in the same die, and permit incorporation of MOS devices on the same die by masking these regions.

As used herein "range" is intended to mean the depth into the implanted material at which the maximum implanted dopant density occurs. The range of dopants can readily be determined by those of skill in the art based on, for example, implant energy. For example, the range of dopants for various implant energies and various dopants can be determined from Ghandi, "VLSI Fabrication Principles," Chapter 6 (1983), which is incorporated herein by reference for all purposes. See, for example, FIG. 6.10. See also, Gibbons et al., "Projected Range Statistics," Dowden (1975), which is also incorporated herein by reference for all purposes.

By providing a low dose implant, damage to the device is low and subsequent thermal cycles will be sufficient to anneal the implant damage. This implant compensates the tail of the base diffusion and raises the pinched base resistance. This effect, combined with the higher collector doping, improves the peak $F_t$ and extends the useful range of emitter current density.

As shown in FIG. 2e, the implant provides first regions 20a and second regions 20b in the collector, each having distinct doping profiles. The boundaries between the first regions and the second regions are substantially aligned to the polysilicon emitter and base contacts. The dopant concentration is higher in the collector region 20a than in the collector regions 20b.

Of course it will be recognized that other contact schemes could be utilized in accordance with the invention herein without departing form the scope thereof. For example, refractory metal local interconnects or metal contacts can be used to further reduce extrinsic base capacitance.

Figure 2F:
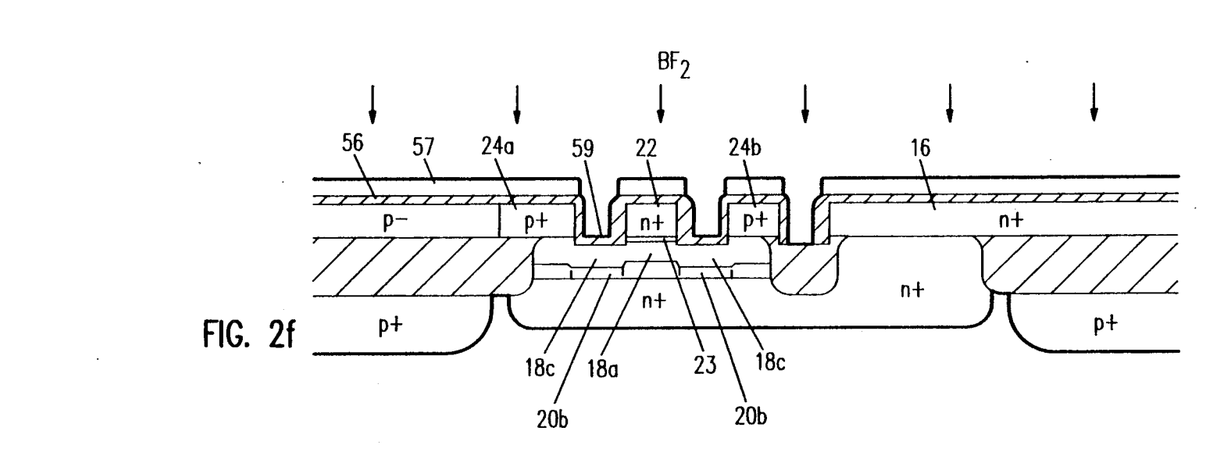

As shown in FIG. 2f, exposed silicon areas are then oxidized to provide an oxide layer 59 having a thickness of about 150 Å. This thermal cycle also serves to diffuse the n+/p+ dopants from the poly emitter/base contacts to form emitter region 23 and to anneal the collector implant damage. A p-type implant is then performed using $BF_2$ to form a moderately doped link base region which is self-aligned to the emitter contact and which extends from the emitter contact to the base contact. The nitride over the polysilicon also serves to mask this implant, thereby self-aligning the link base regions with the emitter contact, as well as the collector regions 20b. The doping level of the exposed base region is adjusted to minimize base resistance and improve the emitter-base breakdown characteristics. In preferred embodiments, the region between the emitter and base contacts is doped to an average dopant concentration of between about $1 \times 10^{17}$ and $\times 10^{19}/cm^3$ with a dopant concentration of about $1 \times 10^{18}/cm^3$ preferred. This base implant uses an implant energy of between about 30 and 50 keV with an implant energy of about 40 keV preferred. The base region 18a below the emitter remains very shallow (on the order of about 0.15 to 0.25 μm in preferred embodiments) while the link base 18c is thicker (on the order of 0.25 to 0.30 μm in preferred embodiments).

Figure 2G:
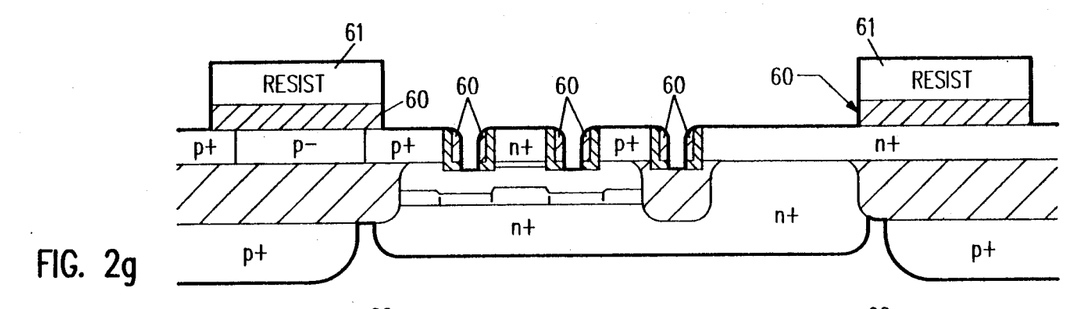

Referring to FIG. 2g, an extrinsic base cap oxidation is performed to anneal implant damage. The nitride over the polysilicon is then removed by a selective etch. A layer of oxide 60 having a thickness of about 0.4 μm is deposited on the surface of the device and a mask 61 is formed to protect areas of the oxide where it is desired not to ultimately produce a silicide interconnect (e.g., over the center portion of the resistor) and a spacer etch is performed using means well known to those of skill in the art to leave oxide sidewalls on the base contacts, the emitter, and the collector contact. The mask 61 is then removed. The oxide is also masked so as to leave oxide on regions of the wafer (not shown) which are not covered by polysilicon (except for the active transistor areas). This increases the ultimate oxide thickness between metal layers and the substrate reducing device capacitance, as well as producing an approximately planar surface for the formation of subsequent levels of oxide/interconnect.

Figure 2H:
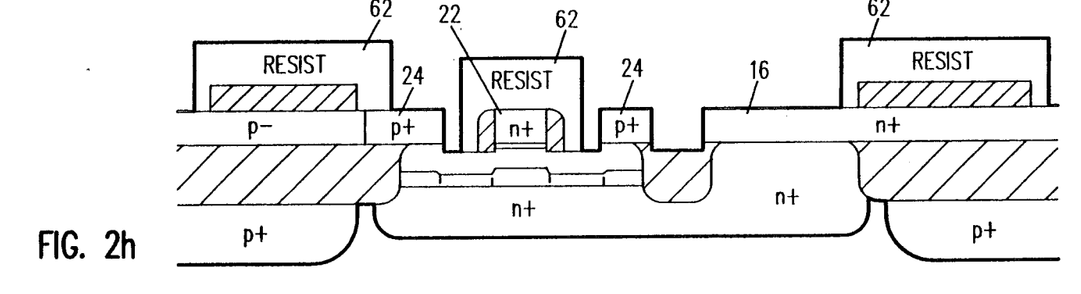

In FIG. 2h, a resist mask 62 is formed on the device which protects the oxide silicide exclusion regions on the resistors and the like, as well as the oxide on the sidewall of the emitter regions of the bipolar transistors. A spacer removal etch is then performed so as to remove oxide from the sidewalls of the base contacts 24 and the collector contact 16, leaving oxide sidewalls on the emitter contact 22, but not on the sidewalls of the base contacts and collector contact.

Figure 2I:
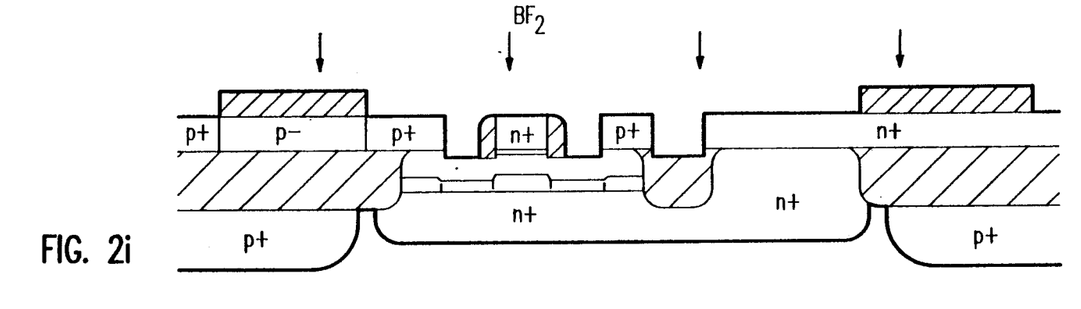

The mask shown in FIG. 2h is then removed and an additional blanket p+ implant is performed as shown in FIG. 2i. The implant is masked from the resistors by the silicide exclusion oxide and serves to increase the dopant concentration of the resistor ends and in the extrinsic base region, thereby reducing the ultimate silicide to silicon/polysilicon contact resistance. The implant uses $BF_2$ at about 40 keV and results in an exposed surface dopant concentration of about $1 \times 10^{19}$ to $1 \times 10^{20}/cm^3$ and a junction depth of about 0.25 to 0.30 μm. A final anneal is then performed for about 20 seconds at about 1,050° C. The use of a rapid thermal anneal improves dopant activation and minimizes encroachment of the extrinsic base under the emitter.

Figure 2J:
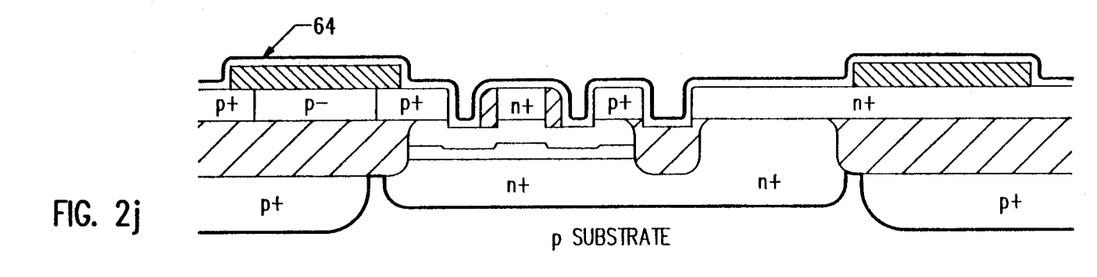
Figure 2K:
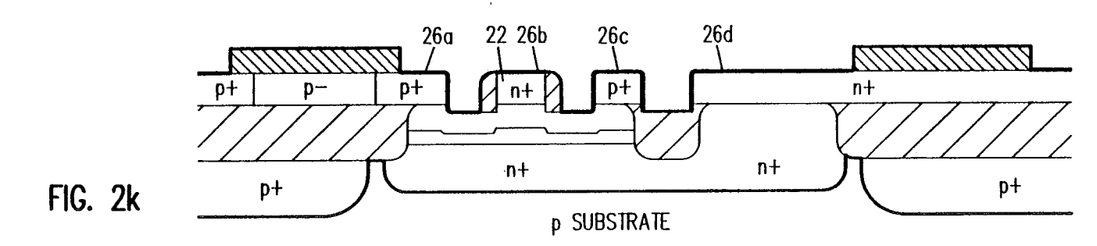

In FIG. 2j, a silicide preclean step is performed to remove residual oxide from regions which are to be silicided. A layer of refractory metal 64 such as titanium is thereafter deposited on the surface of the device. As shown in FIG. 2k, a first silicide reaction step is then carried out in which TiSi is formed over exposed silicon/polysilicon. Excess titanium is then stripped from the device and a second silicide reaction step at a higher temperature (e.g., 800° C.) is carried out in which the silicide sheet resistance is reduced. This leaves silicide straps 26a and 26c on the upper portion and sidewall of the base contacts 24 which further extend along the surface of the extrinsic single-crystal base region up to the sidewall oxide of the emitter. Silicide 26b is left on the upper surface of the emitter contact 22 extending from one sidewall to the opposite sidewall. Similarly, silicide strap 26d is formed on the sidewall and the upper surface of the collector contact.

Figure 2L:
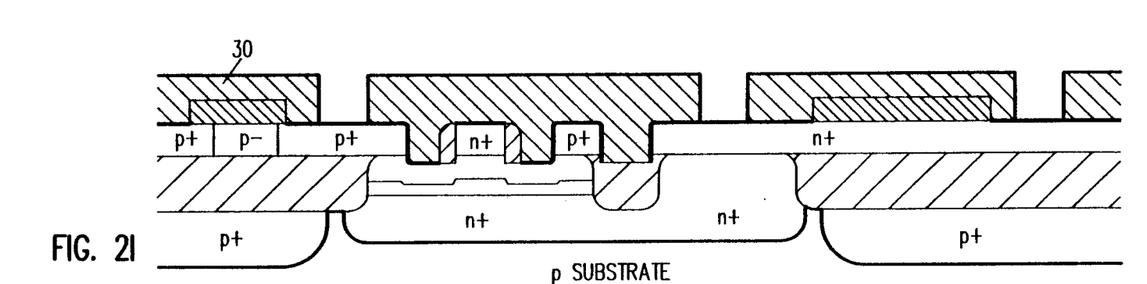

FIG. 21 illustrates the formation of a contact oxide layer 30. The oxide layer is formed by deposition of a CVD oxide, and SOG (Spin On Glass) spincoat using techniques well known as in, for example, U.S. Pat. No. 4,806,504, which is incorporated herein by reference. Thereafter, a planarization etchback is performed to planarize the surface of the device. A chemical vapor deposition cap oxide is then formed and a contact mask is formed so as to define contact regions of the device. Contact metallization is then formed on the contact oxide layer using techniques well known to those of skill in the art, resulting in the device shown in FIG. 1.

III. Device Performance

Figure 3:
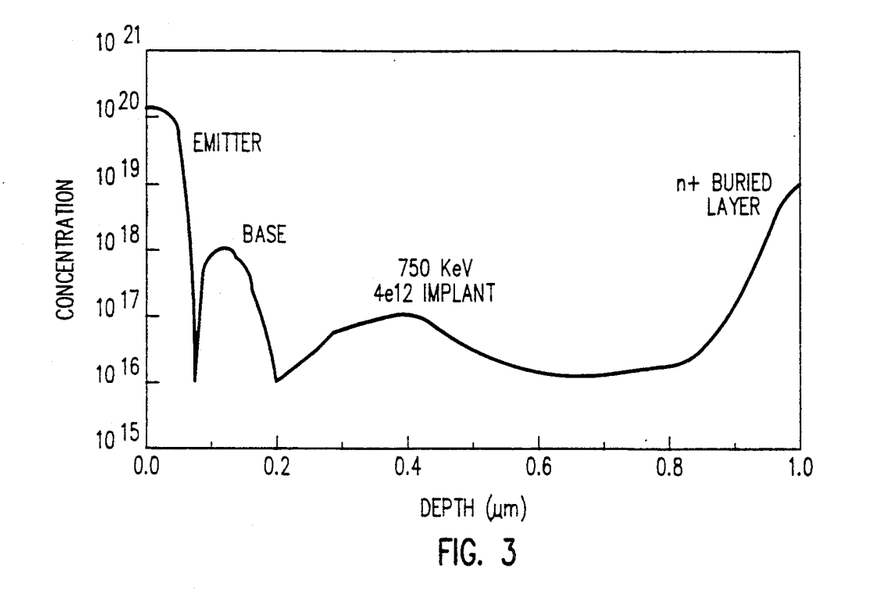
FIG. 3 illustrates the intrinsic base profile for a transistor fabricated according to one embodiment of the invention.
Figure 4:
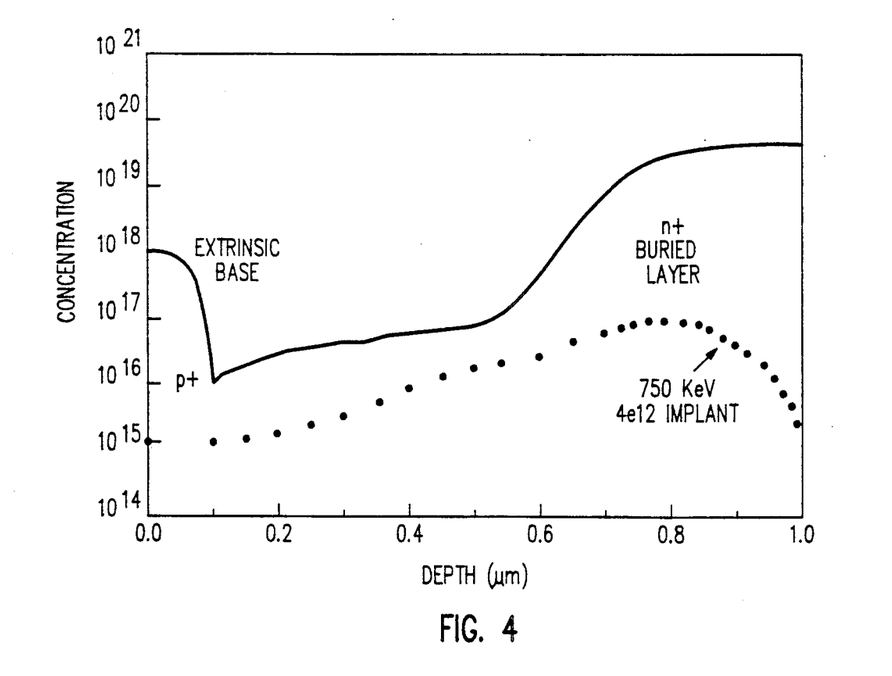
FIG. 4 illustrates the extrinsic base profile for a transistor fabricated according to one embodiment of the invention, along with a plot showing a profile of the dopant concentration resulting from the collector implant alone.

Device characteristics for devices according to one embodiment of the invention were compared with characteristics of devices without collector implants. FIGS. 3 and 4 illustrate the intrinsic transistor doping profile and the extrinsic base profile, respectively, of a transistor fabricated using a 700 KeV collector implant and a dose of $5 \times 10^{12}$ with an emitter stack height (the combined height of the overetch, the polycrystalline silicon, and the nitride layer) of 0.55 μm. This places the peak of the implant just under the intrinsic base-collector junction (i.e., in the buried layer). All results are for 0.8 μm single-poly bipolar devices designed for high density ECL logic arrays. The collector implant compensates the tail of the base diffusion (the portion of the base at about 0.1 μm in FIG. 4) and raises the pinched base resistance by approximately 2 K ohms/sq to 10 K ohms/sq depending on the dose and energy utilized.

Figure 5:
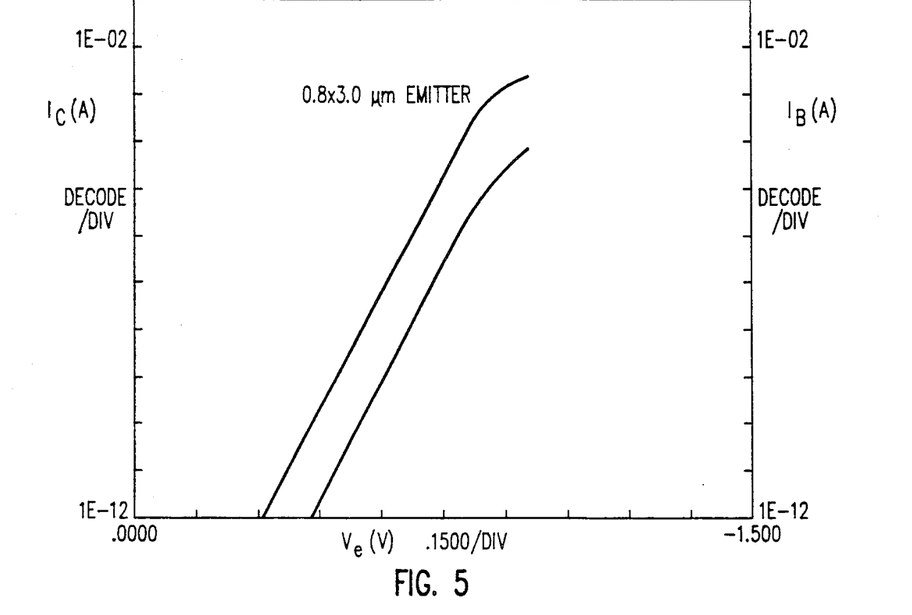
FIG. 5 is a plot of $I_c$ (collector current) and $I_b$ (base current) versus $V_e$ for a transistor fabricated according to one embodiment of the invention.

FIG. 5 provides plots of $I_c$ and $I_b$ versus emitter voltage. These data are very similar to ideal curves, demonstrating that the collector implant induces little damage in the base and collector.

Figure 6:
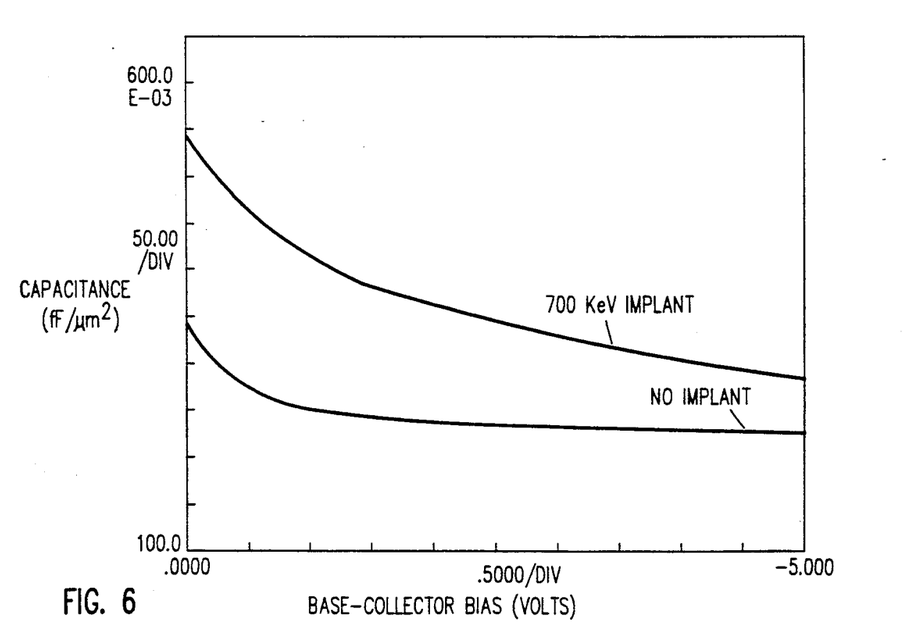
FIG. 6 is a plot of extrinsic base to collector capacitance versus base collector bias for devices having the same epitaxial layer dopant concentration and fabricated with 700 KeV collector implants and with no collector implant, respectively.

FIG. 6 illustrates the ratio of extrinsic base-to-collector capacitance vs. bias for both implanted and non-implanted transistors. At 1 and 2 volts reverse bias the capacitance per unit area is increased significantly As discussed in greater detail below, this effect is mitigated by using an epitaxial layer with lower dopant concentrations (lower than $10^{16}$, preferably on the order of $10^{14}$ to $10^{15}$, and in one embodiment about $2 \times 10^{15}/cm^3$) so that the collector concentration under the extrinsic base area can be reduced (preferably to less than $5 \times 10^{15}$) and the capacitance substantially reduced accordingly.

Figure 7:
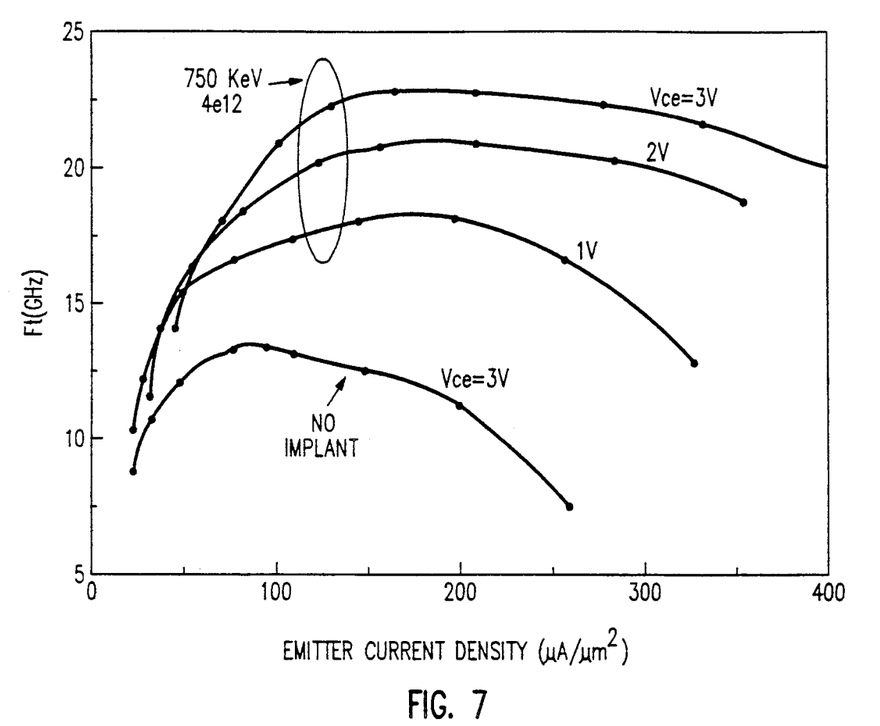
FIG. 7 is a plot at various values of $F_t$ versus emitter current density for devices with 700 KeV collector implants (at varying values of $V_{ce}$) and with no collector implant.

FIG. 7 is a plot of $F_t$ vs. emitter current density comparing transistors which have a collector implant for various values of $V_{ce}$ with those which do not have a collector implant. The compensation of the tail of the base diffusion and the increase in the pinched base resistance, combined with higher collector doping, results in substantially improved $F_t$ and high current roll off. At $V_{cc}=3$ v, for example, the peak $F_t$ is increased from 12 to over 20 GHz and the current density for 10% degradation of the $F_t$ is also dramatically increased, thereby demonstrating substantially improved performance.

Table 1 illustrates various DC parameters of the device versus collector implant energy and dose.

TABLE 1

| | DC Parameters vs. Collector Dose | | | | |
|---|---|---|---|---|---|
| Dose | Energy | Beta | $V_{cbo}$ (volts) | $V_{ceo}$ (volts) | $V_{ebo}$ (volts) |
| None | | 90 | 22.0 | 10.9 | 6.2 |
| 4E12 | 600 keV | 180 | 15.5 | 3.8 | 6.4 |
| 2E12 | 750 keV | 125 | 19.6 | 6.4 | 6.3 |
| 4E12 | 750 keV | 160 | 16.1 | 4.7 | 6.4 |
| 8E12 | 750 keV | 185 | 13.0 | 3.7 | 6.3 |
| 4E12 | 900 keV | 115 | 17.7 | 5.7 | 6.2 |

Figure 8:
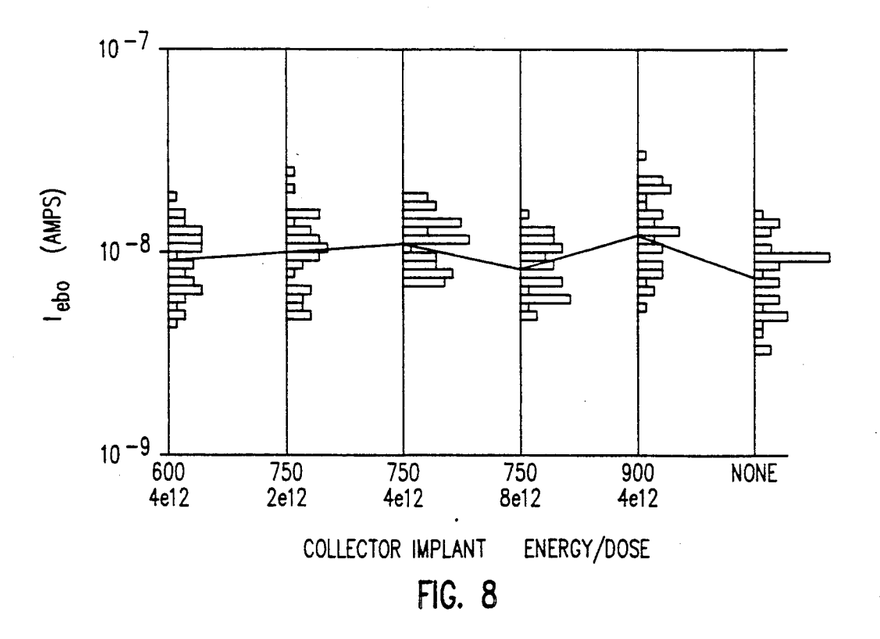
FIG. 8 is a bar plot of emitter-base leakage ($I_{ebo}$) for devices fabricated with 600, 750, 900 keV implants with varying doses, as compared to devices with no implant.

FIG. 8 illustrates emitter-base leakage current vs. collector implant energy and dose for devices fabricated according to the invention herein and compared to those without a collector implant. The graph is a series of histograms indicating the number of occurences of various values of $I_{ebo}$. FIG. 8 shows that the process has little effect on emitter-base junction leakage.

Figure 9:
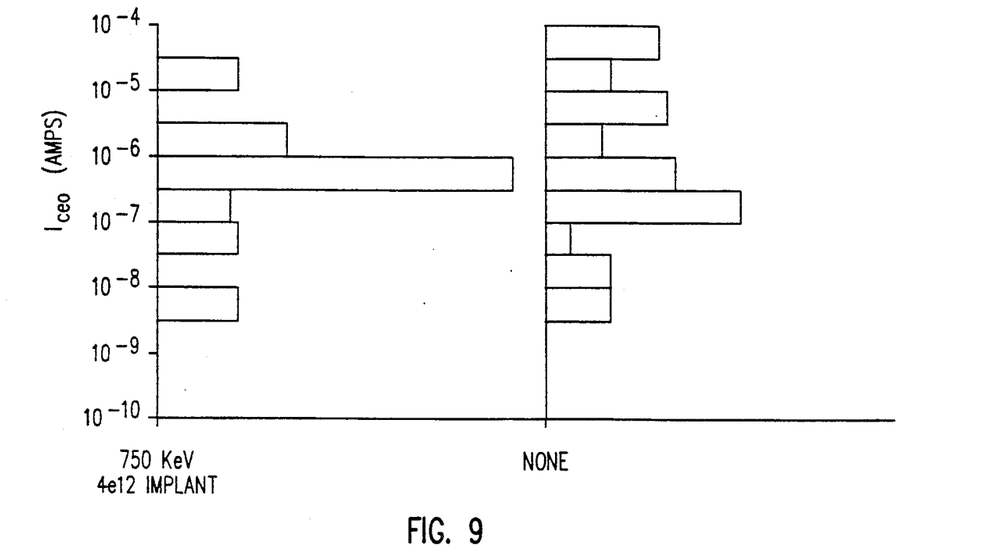
FIG. 9 is a bar pot illustrating $I_{ceo}$ for eight thousand devices fabricated with and without collector implants.

FIG. 9 illustrates $I_{ceo}$ for eight thousand NPN devices with a 750 keV implant as compared to those without an implant. FIG. 9 shows that the process has little effect on collector emitter leakage current.

Figure 10:
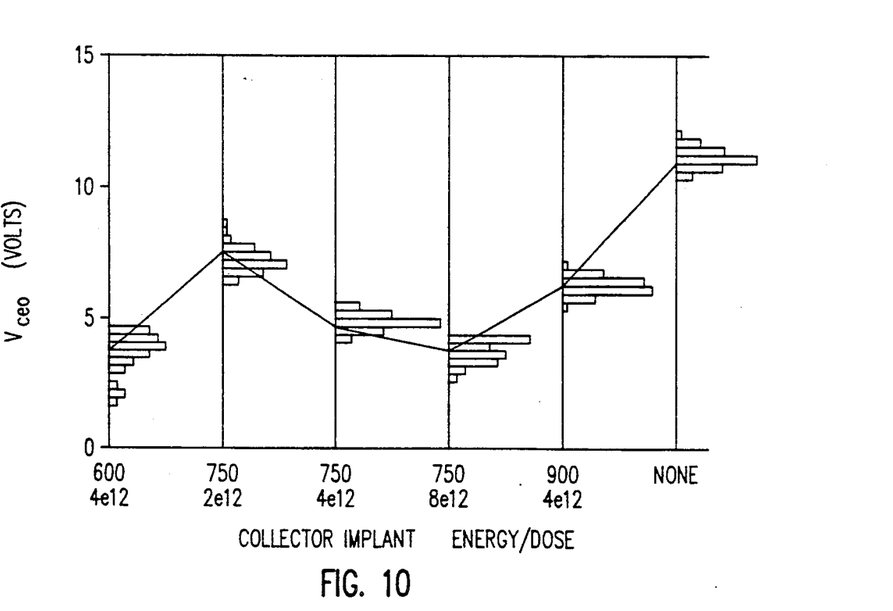
FIG. 10 is a bar plot of $V_{ceo}$ for devices fabricated with varying implant doses and energies as compared to devices without a collector implant.

FIG. 10 is a plot showing the value of $V_{ceo}$ for a number of devices fabricated with varying implant energies and doses as compared to devices with no collector implant. FIG. 10 shows that $V_{ceo}$ is reduced slightly when devices are fabricated according to the invention herein. While there is a collector voltage breakdown impact, it is likely occurring due to decreasing base width and not due to residual damage as evidenced by the tight grouping of the histograms.

Figure 11:
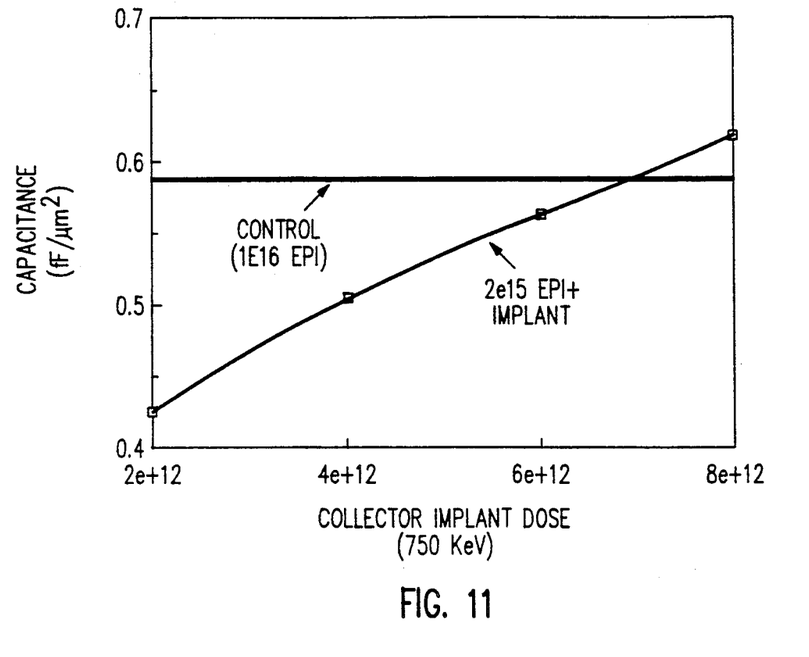
FIG. 11 is a plot of measured extrinsic base to collector capacitance for devices with varying collector implant doses (at 750 keV) as compared to a control device without an implant. The control had $1 \times 10^{16}/cm^3$ epi while the collector implanted devices had a $2 \times 10^{15}/cm^3$ epitaxial dopant concentration.

FIG. 11 is a plot of extrinsic base to collector capacitance versus collector implant dose for devices fabricated with a 750 keV implant and varying implant doses. The implanted case is with a $2 \times 10^{15}/cm^3$ epi is compared to a non-implanted case with $1 \times 10^{15}/cm^3$ epi. As shown, with the lower epitaxial silicon dopant concentration, the collector capacitance can actually be reduced when doses of less than about $7 \times 10^{12}$ are used (at 750 keV). At the same time, other device performance parameters are substantially improved. Naturally, the preferred epitaxial layer dopant concentration will vary depending on the particular devices in question and the implant energy/dose selected. In some embodiments, epitaxial doping is reduced to less than $10^{15}$, less than about $5 \times 10^{14}/cm^3$, or even less than about $1 \times 10^{14}/cm^3$.

Figure 12:
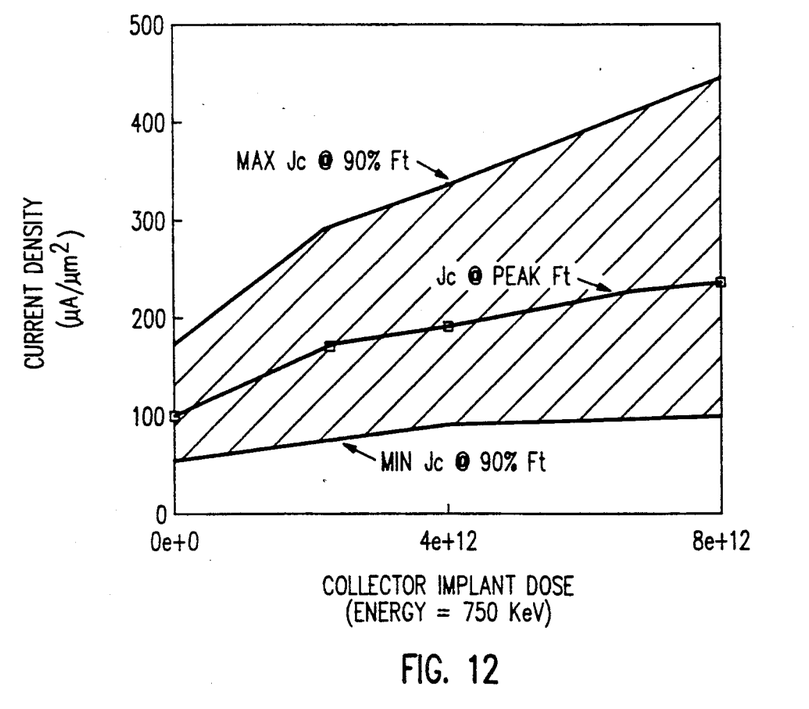
FIG. 12 illustrates maximum and minimum current density versus implant dose for devices fabricated with an implant energy of 750 keV at the peak $F_t$ and 90% of the peak $F_t$.

FIG. 12 is a plot of $J_c$ versus collector implant energy for devices fabricated with fixed implant energy of 750 keV. FIG. 12 shows that the peak useful current density, as well as the range of useful current densities, is increased.

Figure 13:
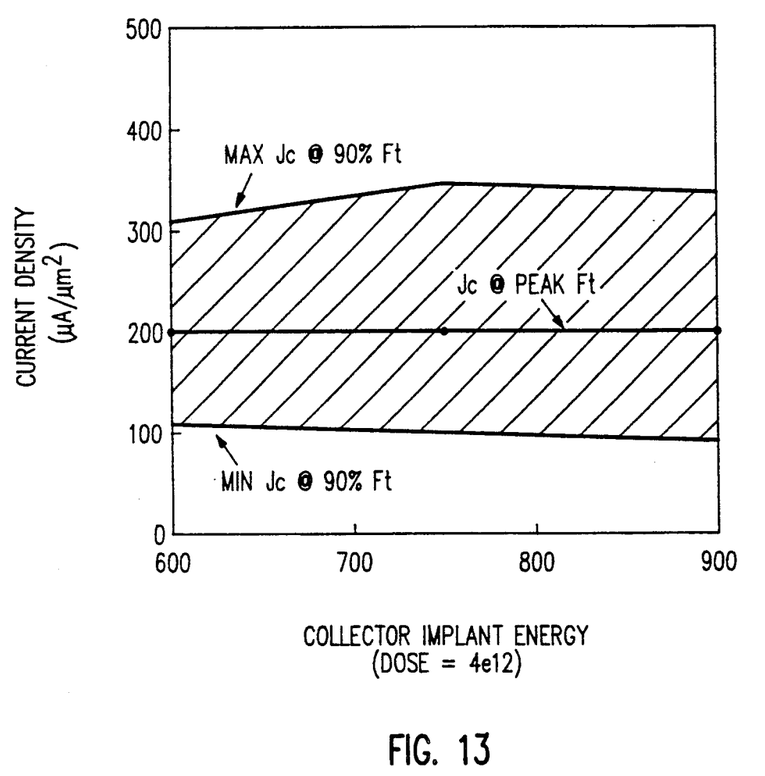
FIG. 13 illustrates maximum and minimum current density ($J_c$) versus collector implant energy for devices fabricated with a dose of $4 \times 10^{12}$ at 90% of the maximum $F_t$ and at the peak value of $F_t$.

FIG. 13 is a plot of current density ($J_c$) versus collector implant energy for devices fabricated with a dose of $1 \times 10^{12}$. The minimum and maximum $J_c$'s are illustrated at 90% of $F_t$, as well as J at the peak $F_t$. FIG. 13 shows the implant energy is a second order effect and dose is a first order effect. This shows that even with film thickness variations devices will be made in a consistent manner.

It is to be understood that the above description is intended to be illustrative and not restrictive. Many variations of the invention will become apparent to those of skill in the art upon review of this disclosure. Merely by way of example, while the invention is illustrated primarily with regard to npn devices, the invention is not so limited and could readily be applied to pnp devices. By way of further example, while the invention is illustrated with regard to particular dopants, dopant concentrations, implant energies, and implant doses, the invention is not so limited and a variety of dopants, dopant concentrations, implant energies, and doses could readily be utilized without departing from the scope of the invention. The scope of the invention should, therefore, be determined not with reference to the above description, but instead should be determined with reference to the appended claims along with their full scope of equivalents.

WHAT IS CLAIMED IS:

1. A method of forming a semiconductor structure having an emitter, a base, and a collector, comprising the steps of:
   a) in semiconductor material having a first surface, forming a base region above a collector region, said base region of a first conductivity type, said collector region of a second conductivity type, said base region and said collector region forming a base collector junction;
   b) forming an emitter contact above said base region, said emitter contact extending to said first surface; and
   c) thereafter, performing a collector implant, said collector implant implanting dopants of said second conductivity type using an implant energy selected such that a range of said dopants of second conductivity type under said emitter contact is below said base collector junction.

2. The method as recited in claim 1 preceded by the step of forming a collector buried layer below said collector region, said collector buried layer having a dopant concentration higher than said collector region and wherein a range of said dopants in regions adjacent said emitter contact is in said buried layer.

3. The method as recited in claim 1 wherein said emitter contact is formed by the steps of:
   a) depositing a layer of polysilicon on said major surface;
   b) depositing a layer of nitride on said polysilicon; and
   c) etching said layer of nitride and said polysilicon to form said emitter contact, said nitride and said emitter contact masking said collector implant.

4. The method as recited in claim 3 wherein said step of etching also forms polysilicon base contacts in contact with said base region, said base contacts also masking said collector implant.

5. The method as recited in claim 3 further comprising the steps of:
   a) implanting a portion of said polysilicon layer with dopants of said second conductivity type; and
   b) diffusing a portion of said dopants of second conductivity type from said emitter contact through said first surface to form a emitter region.

6. The method as recited in claim 3 wherein the step of forming a base region comprises the steps of:
   a) implanting at least a portion of said polysilicon layer with dopants of said first conductivity type; and
   b) diffusing at least a portion of said dopants of said first conductivity type through said first surface to form said base region.

7. The method as recited in claim 1 wherein said collector implant is an unmasked implant.

8. The method as recited in claim 1 wherein said collector region is formed in a deposited epitaxial layer of said second conductivity type, a range of said dopants under said emitter contact within said epitaxial layer.

9. The method as recited in claim 3 further comprising a link base implant step, said link base implant step comprising the step of implanting dopants of said first conductivity type, said dopants of first conductivity type having a range less than a range of said collector implant.

10. The method as recited in claim 1 wherein said implant energy of said collector implant is greater than about 300 KeV.

11. The method as recited in claim 1 wherein said implant energy of said collector implant is between about 650 to 750 KeV.

12. The method as recited in claim 3 wherein said implant energy of said collector implant is selected to provide a range deeper than a thickness of said polysilicon.

13. The method as recited in claim 3 wherein said implant energy of said collector implant is selected to provide a range deeper than about 0.5 $\mu$m.

14. The method as recited in claim 1 wherein a dose of said collector implant is between about $10^{12}$ and $10^{13}$.

15. The method as recited in claim 1 wherein a dose of said collector implant is about $10^{12}$.

16. The method as recited in claim 1 wherein said collector implant increases the frequency at which the collector emitter current gain of the structure is unity.

17. The method as recited in claim 1 wherein said collector region underlying and between said emitter contact has a peak dopant concentration of about $10^{17}/cm^3$.

18. The method as recited in claim 1 wherein said collector region within an epitaxial layer has a peak dopant concentration of less than about $5 \times 10^{16}$.

19. A method of forming a bipolar transistor comprising the steps of:
   a) implanting an n-type buried layer into a p-type semiconductor substrate;
   b) forming an n-type epitaxial layer on said substrate;
   c) implanting n-type dopants into said substrate to form a collector sink in contact with said buried layer;
   d) forming a polysilicon layer on said epitaxial layer;
   e) implanting p-type dopants into said polysilicon layer;
   f) diffusing said p-type dopants from said polysilicon layer into said epitaxial layer to form a base region of said transistor;
   g) selectively implanting n- and p-type dopants into selected emitter contact, collector contact, and base contact regions of said bipolar transistor;
   h) forming a layer of nitride on said polysilicon layer;
   i) etching said layer of nitride and said polysilicon layer to form said emitter, base and collector contacts;
   j) implanting phosphorous with an implant energy of between about 650 and 750 KeV and a dose of about $10^{12}$ across a surface of said transistor;
   k) implanting p-type dopants across a surface of said transistor to form link base regions of said transistor; and
   l) selectively forming oxide and silicide regions on said transistor so as to define a contact structure for said transistor.

* * * * *